(12) United States Patent
Wilcox et al.

(10) Patent No.: US 10,784,622 B1
(45) Date of Patent: Sep. 22, 2020

(54) ADJUSTABLE SPACER FOR PRINTED CIRCUIT ASSEMBLY STIFFENER

(71) Applicant: Arista Networks, Inc., Santa Clara, CA (US)

(72) Inventors: Robert Wilcox, Santa Clara, CA (US); Richard Hibbs, Santa Clara, CA (US); Youngbae Park, Santa Clara, CA (US); Gary Myers, Santa Clara, CA (US); Matthew Gawlowski, Santa Clara, CA (US); Rui Jia, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 16/291,955

(22) Filed: Mar. 4, 2019

(51) Int. Cl.
*H01R 13/629* (2006.01)
*H01R 12/73* (2011.01)

(52) U.S. Cl.
CPC .......... *H01R 13/629* (2013.01); *H01R 12/73* (2013.01)

(58) Field of Classification Search
CPC .... H01R 13/62; H01R 13/627; H01R 13/629; H01R 12/73; H05K 2201/2036
See application file for complete search history.

(56) References Cited

U.S. PATENT DOCUMENTS

| | | | | |
|---|---|---|---|---|
| 4,413,399 A | * | 11/1983 | Crawford | H01R 13/629 29/267 |
| 4,429,936 A | * | 2/1984 | Rusenko | H01H 85/204 337/194 |
| 4,509,813 A | * | 4/1985 | Hesse | H01R 12/716 439/347 |
| 5,309,325 A | * | 5/1994 | Dreher | H05K 7/1409 361/754 |
| 6,579,029 B1 | * | 6/2003 | Sevde | H05K 7/1409 403/321 |
| 7,588,462 B2 | * | 9/2009 | Ngo | H01R 13/506 439/607.05 |
| 10,374,359 B1 | * | 8/2019 | Dong | H01R 13/627 |
| 2002/0098731 A1 | * | 7/2002 | Varone | H01R 13/6397 439/347 |

* cited by examiner

*Primary Examiner* — Oscar C Jimenez
(74) *Attorney, Agent, or Firm* — Fountainhead Law Group, PC (57) ABSTRACT

An adjustable spacer is provided. The adjustable spacer includes a first body having a first retention member for securing or retaining the first body to a support member and a second body having a tapered cross-section. The second body is positionable along a surface of the first body to adjust a thickness across a combination of the first body and the second body, and the first body has a second retention member for retaining the second body to the first body.

20 Claims, 8 Drawing Sheets

ADJUSTABLE SPACER FOR PRINTED CIRCUIT ASSEMBLY STIFFENER

BACKGROUND

Electronics assemblies and connectors for coupling one electronics assembly to another are many and varied. Electronic assemblies are typically composed of a printed circuit assembly (PCA) and the mechanical housing to enclose or support the printed circuit assembly, which may include a stiffener to mechanically reinforce the PCA. Printed circuit boards, housings, support members and other mechanical and electrical components can flex as a result of forces applied during the assembly process, as well as during transport and use. Furthermore, for reliable electrical connections, appropriate mating of the connector as designed should be established. Depending on the connector design, the appropriate mating of the connector requires precise and stable alignment of the mating connector. High-speed signals and large numbers of connections, with attendant high pin count connectors, tend to exacerbate these requirements. For example, when a connector requires a relatively high mating force and if the connector is not properly supported during the assembly, the torsion can cause misalignment in the final assembly. Traditional solutions to mitigate assembly torsion include adding stiffeners to a printed circuit board, using thicker printed circuit boards, enclosing circuits in a rigid housing or frame, using clamps on connectors, mounting connectors at ends of cables, use of special tools for installation, etc. Some of the solutions may not be applicable for various reasons, such as cost, reliance on printed circuit board thickness for circuit trace impedance, or reduction or elimination of cabling for cost reduction and short signal paths for high-speed signals. Even with some of the above solutions, an electronics assembly may flex, and misalign connectors. In such case, a stiffener which can support the connector, not only the printed circuit board, in a cost effective manner is desirable. It is within this context that the embodiments arise.

SUMMARY

In some embodiments, an adjustable spacer is provided. The adjustable spacer includes a first body having a first retention member for securing or retaining the first body to a support member and a second body having a tapered cross-section. The second body is positionable along a surface of the first body to adjust a thickness across a combination of the first body and the second body, and the first body has a second retention member for retaining the second body to the first body. In some embodiments, the spacer is used to fill the gap between the stiffener and an electronic component on the printed circuit board assembly, so that the stiffener can provide mechanical support to the component at least in one direction.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A mechanism to provide mechanical support for an electronics assembly, and a related method, are provided. The electronics assembly, which could be or include a populated printed circuit board (PCB), a circuit card, a tray, a drawer, an electronics box, etc., flexes as connectors of the electronics assembly are mated to connectors of another assembly such as a mid-plane, back-plane, card cage, printed circuit board, etc. In one mechanism, described below, an adjustable spacer is mounted so as to adjust to fill spacing and press against each of one or more connectors in an electronics assembly. The adjustable spacer has two bodies, one of which is inserted into at least a portion of the other and adjusted to set thickness and spacing of the adjustable spacer. Correctly adjusted thickness and spacing results in the spacer pressing against a connector to oppose assembly force imparted by assembly of that connector to another connector. The adjustable spacer could be made out of various plastics, or even metals, optimally with some flexibility (e.g., for fingers) but not necessarily so for all embodiments. For both types of mechanisms, variations in shape, mountings and numbers and types of features are readily devised in keeping with the teachings herein. In some embodiments, instead of using a spacer assembled from two bodies between the stiffener and the connector, a single body spacer can be installed between the stiffener and the connector by including the tapered feature described herein to the stiffener. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

Figure 1:
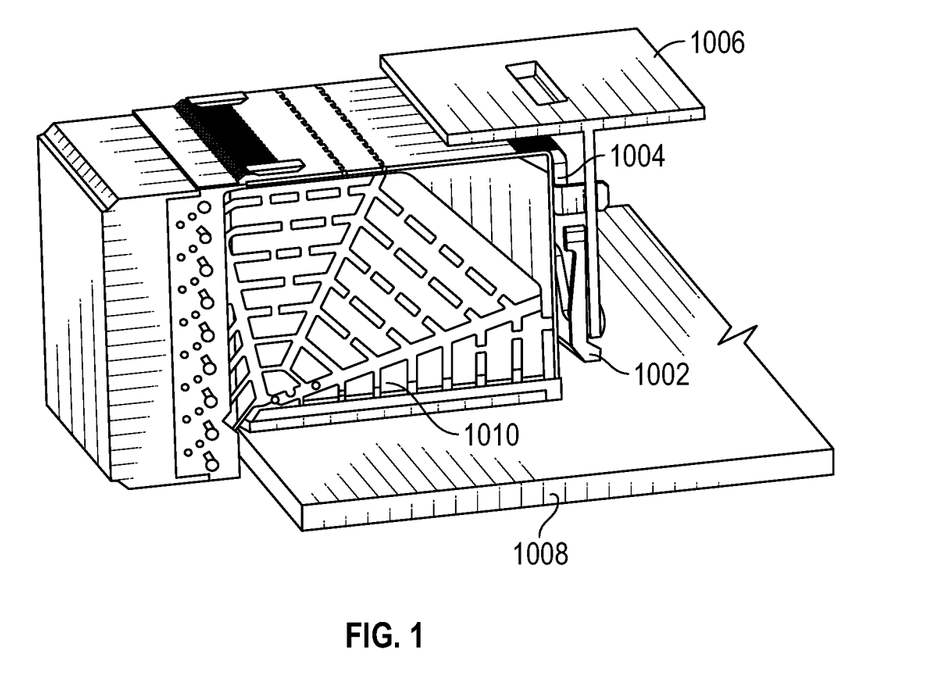
FIG. 1 is a perspective view of an electronics assembly that has a connector and an adjustable spacer in accordance with some embodiments.

FIG. 1 is a perspective view of a further electronics assembly that has connector 1010 and an adjustable spacer in accordance with some embodiments. Connector 1010 is mounted or affixed to printed circuit board 1008, e.g., by soldering or perhaps with fastener(s), but could be mounted in other ways and to other fixtures as readily devised. Support member 1006 may be mounted to a chassis. In some embodiments, support member 1006 is a stiffener that stiffens, or decreases flexing in the chassis, printed circuit board 1008 or both. Because of manufacturing tolerances, there is a variable amount of space or spacing between connector 1010 and support member 1006. Without some mechanism to mitigate these circumstances, printed circuit board 1008 can flex during assembly when connector pieces are mated. The adjustable spacer, which has first body 1002 and second body 1004, is located (or at least, has a portion in various embodiments) between support member 1006 and connector 1010 and adjusted as to thickness to fill this spacing, as further described below. With the adjustable spacer so adjusted and pressing outward against—or filling a gap between—both support member 1006 and connector 1010, connector 1010 is braced against assembly forces, preventing or reducing flexure of printed circuit board 1008 (or other chassis member(s) in further embodiments).

Figure 2A:
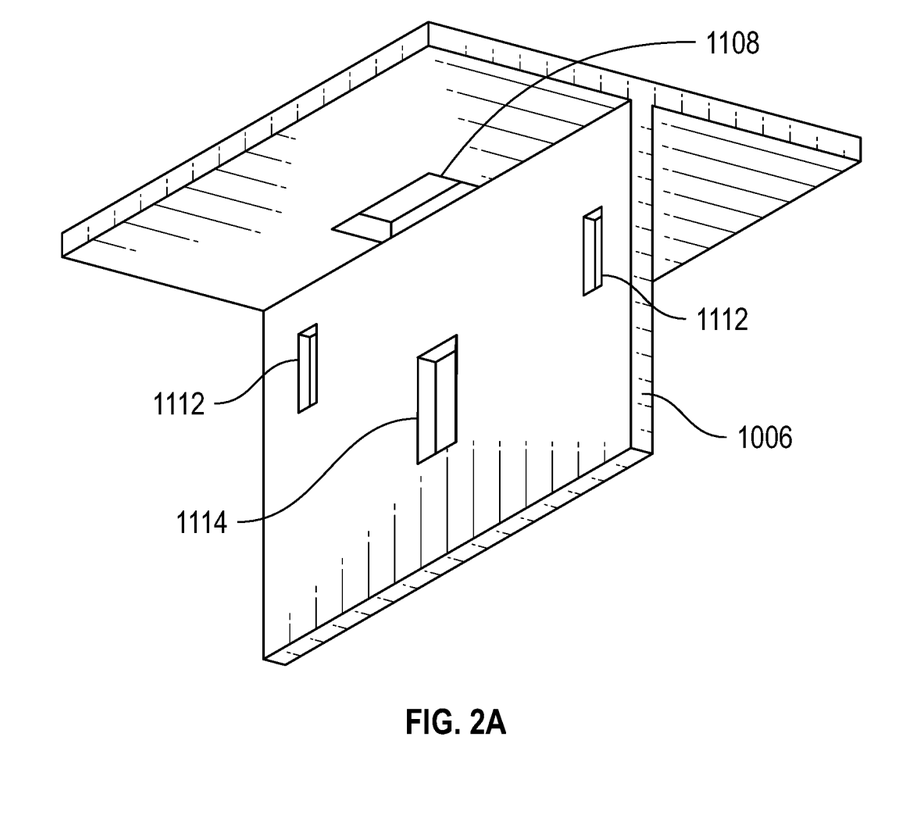
FIG. 2A is a perspective view of a support member to which the adjustable spacer can be mounted, in some embodiments.

FIG. 2A is a perspective view of a support member 1006 to which an adjustable spacer as disclosed can be mounted, in some embodiments. This support member 1006 is seen, but largely obscured, in FIG. 1. Two apertures 1112 in the support member 1006 receive posts of the first body of the adjustable spacer, acting to locate and stabilize the adjustable spacer as the adjustable spacer is adjusted. Another aperture 114 in the support member 1006 receives a tab of the first body 1002 of the adjustable spacer, acting to further locate and stabilize the adjustable spacer and accommodating the tab to retain and guide second body 1004 of the adjustable spacer. Yet another aperture 1108 in the support member allows manual or tool access to second body 1004, for relative placement and adjustment of second body 1004 in the adjustable spacer.

Figure 2B:
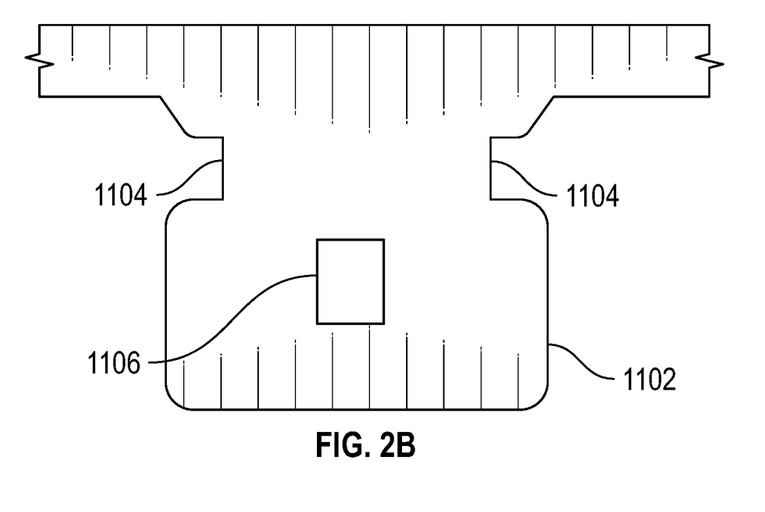
FIG. 2B is a plan view of a further support member to which the adjustable spacer can be mounted, in some embodiments.

FIG. 2B is a plan view of an alternative support member 1102 to which the adjustable spacer can be mounted, in some embodiments. Instead of apertures 1112 as shown in FIG. 2A to receive posts of the first body of the adjustable spacer, support member 1102 has notches 1104 that receive posts of the first body of the adjustable spacer. In a still further embodiment, a support member 1102 could have depressions, guide ridges, slots or other receiving features to receive posts of the first body of the adjustable spacer, i.e., post-receiving features, or another mechanism for guiding and stabilizing the support member in an assembly of the adjustable spacer and a support member. Aperture 1106 in support member 1102 receives a tab of first body 1002 of the adjustable spacer, much as in FIG. 2A. In yet further embodiments, the adjustable spacer is mounted otherwise, and may be indirectly or directly, mounted to the support member.

Figure 3A:
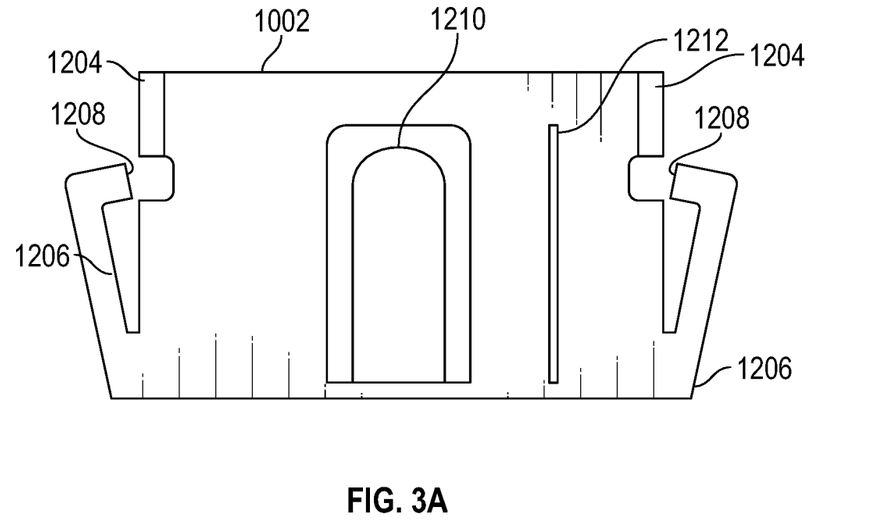
FIG. 3A depicts a face of a first body of the adjustable spacer, in one embodiment.

FIG. 3A depicts a face of first body 1002 of the adjustable spacer, in one embodiment. This face is internal to the adjustable spacer, and faces and contacts second body 1004 when second body 1004 is assembled to first body 1002 to form the adjustable spacer. Two posts 1204 extend towards the viewer from the majority portion of the first body 1002, in FIG. 3A, to be received by apertures 1112 of support member 1006 of FIG. 11A, or notches 1104 of support member 1102 of FIG. 2B. Two fingers 1206 extend to sides of the majority portion of first body 1002, each ending in a tip 1208. The tips 1208 of fingers 1206 clasp or grasp sides of second body 1004 of the adjustable spacer (see FIG. 8B), thus retaining second body 1004 as further shown and described below. A third finger 1210 extends from a lower edge of the majority portion of first body 1002, to retain and guide second body 1004 relative to first body 1002 (see FIG. 5B). Posts 1204 may also serve to guide and retain second body 1004 in the adjustable spacer (see FIGS. 8A and 8B). In one embodiment, first body 1002 has groove 1212 that engages a ridge on second body 1004 (see FIG. 5B), to further guide and stabilize second body 1004 relative to first body 1002.

Figure 3B:
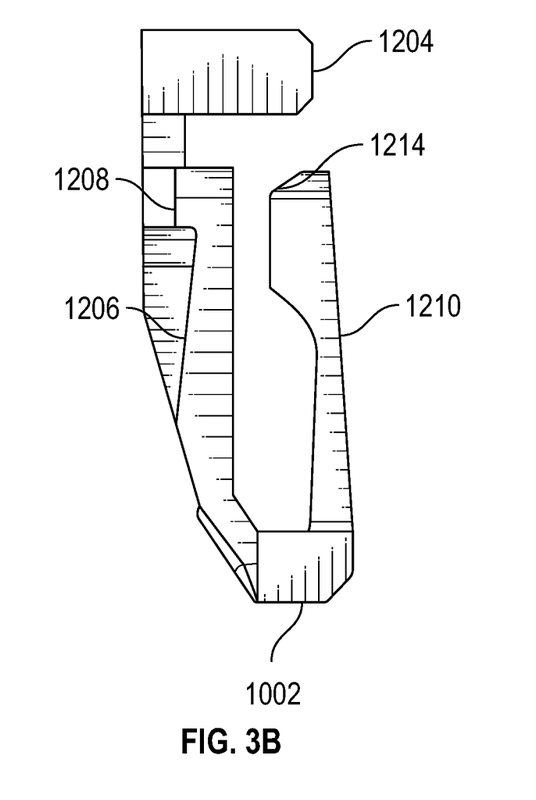
FIG. 3B is a side view of the first body of the adjustable spacer, in one embodiment.

FIG. 3B is a side view of first body 1002 of the adjustable spacer, in one embodiment. It is more clear in this depiction how first and second fingers 1206, with tips 1208, and third finger 1210, with tab 1214, cooperate to surround a space into which second body 1004 is inserted, and retain second body 1004 to first body 1002. Also more visible in this side view are posts 1204 extending from the majority portion of first body 1002. One post 1204 is visible, the other post 1204 is obscured in this side view. One finger 1206 is visible, the other finger 1206 is obscured. Vertical, and facing leftward in FIG. 3B, a face of first body 1002 is also an external or outward face of the adjustable spacer. This external face butts against connector 1010 in FIG. 1, while posts 1204 extend through apertures 1112 in support member 1006 (see FIGS. 1 and 2A).

Figure 4A:
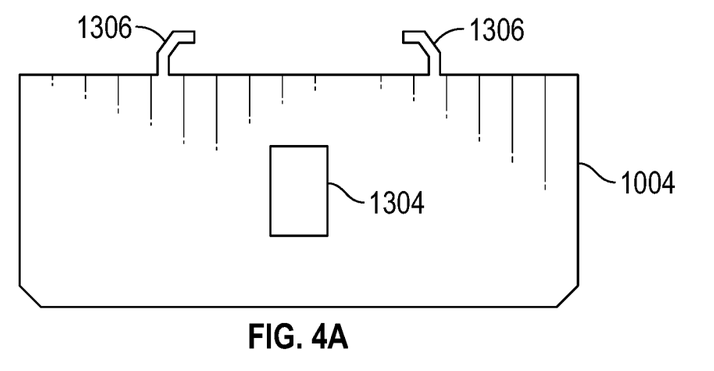
FIG. 4A depicts a face of a second body of the adjustable spacer, in one embodiment.

FIG. 4A depicts a face of a second body 1004 of the adjustable spacer, in one embodiment. This face is external to the adjustable spacer, facing outward to contact support member 1006 (or other support member or surface against which to press in further embodiments) when second body 1004 is assembled to first body 1002 to form the adjustable spacer. Groove 1304, centered to second body 1004 and vertical in orientation in this embodiment, is dimensioned to receive tab 1214 at the tip of third finger 1210 of first body 1002 of the adjustable spacer. Groove 1304 slides along tab 1214, or vice versa, as second body 1004 is inserted into and adjusted relative to first body 1002 of the adjustable spacer. Projections 1306 from the top edge of second body 1004 could be various shapes in various embodiments, and serve to engage a tool or possibly a finger of a user during positioning and adjustment of second body 1004. While illustrated as two projections 1306, various embodiments may have one or more such projections to accommodate manual manipulation or any of a variety of generic or specialized tools.

Figure 4B:
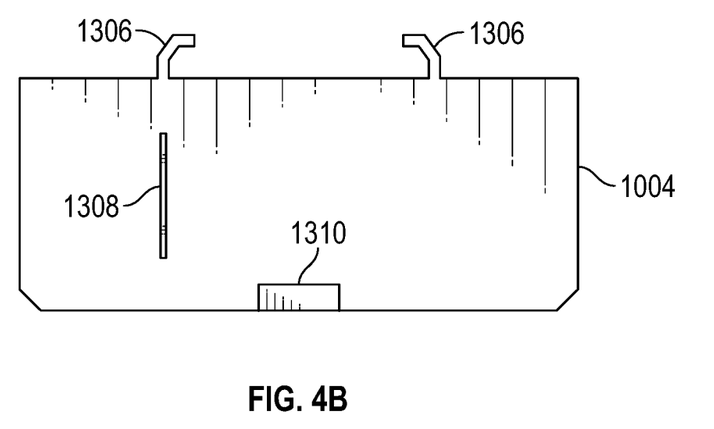
FIG. 4B depicts an opposed face of the second body of the adjustable spacer, in one embodiment.

FIG. 4B depicts an opposed face of second body 1004 of the adjustable spacer, in one embodiment. The view in FIG. 4B is obtained by flipping or rotating the second body 1004 about a vertical axis from the view in FIG. 4A, and shows the face of the second body 1004 that contacts and slides along a face of the first body 1002 that is facing towards the viewer in FIG. 3A and facing rightward (but partially obscured) in FIG. 2B. These two faces that slide along each other are inner faces of the adjustable spacer. Ridge 1308, on this face of second body 1004 in some embodiments, engages groove 1212 (see FIG. 3A) in the face of the first body that this face of the second body 1004 slides along during adjustment. Engagement of ridge 1308 and groove 1212 aligns and stabilizes second body 1004 with first body 1002. Tab 1310 projecting towards the viewer from this face of second body 1004 in FIG. 4B is positioned in an opening 1704 of first body 1002 (see FIG. 8A), aiding in alignment and retention of second body 1004 to first body 1002 in the adjustable spacer.

Figure 4C:
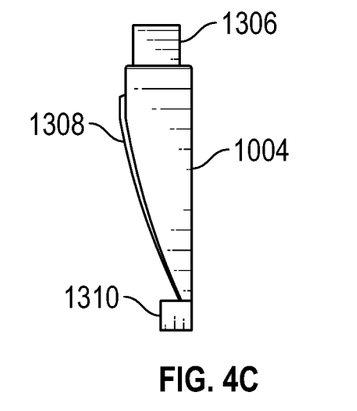
FIG. 4C is a side view of the second body of the adjustable spacer, in one embodiment.

FIG. 4C is a side view of second body 1004 of the adjustable spacer, in one embodiment. The face of the second body 1004 depicted in FIG. 4A is to the right in FIG. 4C, and the face of the second body 1004 depicted in FIG. 4B is to the left in FIG. 4C, with the ridge 1308 visible also to the left. At the top of the second body 1004, one of the projections 1306 is visible, while the other is obscured. The tab 1310 extends to the left, at the bottom of the second body 1004.

Figure 5A:
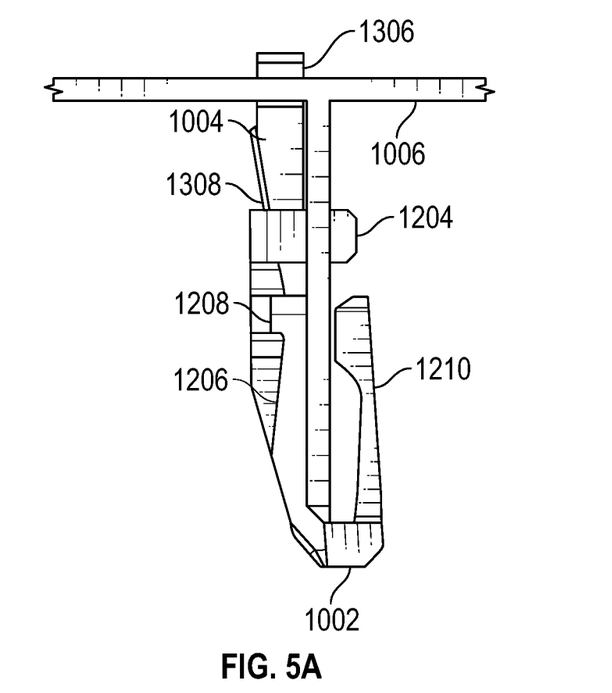
FIG. 5A is a projected side view of the adjustable spacer mounted to the support member of FIG. 2A, in one embodiment, with the second body partially inserted to the first body to achieve a lesser thickness and spacing.

FIG. 5A is a projected side view of the adjustable spacer mounted to the support member 1006 of FIG. 2A, in one embodiment, with the second body 1004 partially inserted to the first body 1002 to achieve a lesser thickness and spacing. Posts 1204 of the first body 1002 pass through the support member 1006, e.g., through apertures 1112 of support member 1006 (see FIG. 2A) or notches 1104 of support member 1102 (see FIG. 2B), aligning and slidably holding the first body 1002 in place to the support member 1006. The third finger 1210 and the first and second fingers 1206 (one shown, the other obscured) of the first body 1002 touch and retain the second body 1004 to the first body 1002 of the adjustable spacer. Projections 1306 of the second body 1004 pass through the aperture 1108 in the support member 1006, and can be pressed manually or with the use of a tool to lower or further insert the second body 1004 into the first body 1002 and increase the thickness of the adjustable spacer (see FIG. 5B for comparison). With the positioning depicted in FIG. 5A, the thickness of the adjustable spacer is at a minimum and fingers 1206 of first body 1002 are pressed against the support member 1006. Dimensions of first body 1002 and second body 1004 should be set so that the thickness of the adjustable spacer, i.e., the distance from one external or outward face of the adjustable spacer to another external or outward face of the adjustable spacer in this minimum thickness arrangement, is less than or equal to the minimum spacing between connector 1010 (or other component) and support member 1006 (or other member or surface) resulting from manufacturing tolerances.

Figure 5B:
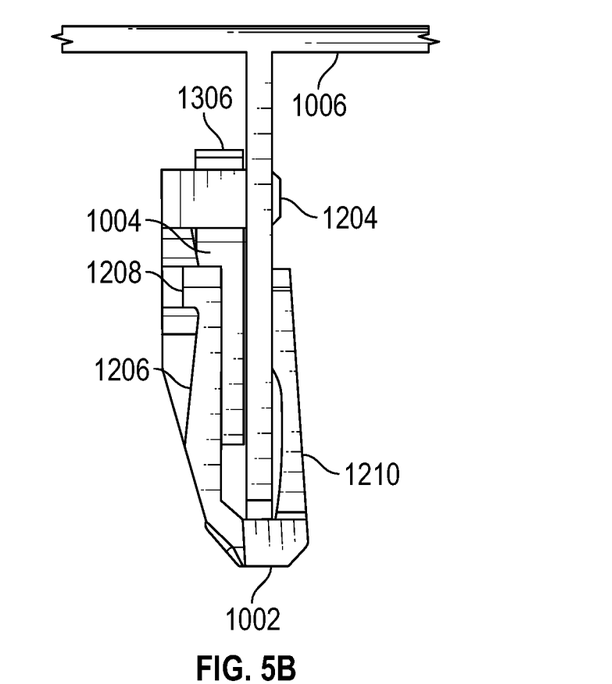
FIG. 5B is a projected side view of the adjustable spacer mounted to the support member of FIG. 2A, in one embodiment, with the second body more fully inserted to the first body to achieve a greater thickness and spacing.

FIG. 5B is a projected side view of the adjustable spacer mounted to the support member 1006 of FIG. 2A, in one embodiment, with the second body 1004 more fully inserted to the first body 1002 to achieve a greater thickness and spacing. Projections 1306 of the second body 1004 are no longer visible above the support member 1006, as the second body 1004 is lower and more fully inserted than in FIG. 5A. Because of wedge action explained further below with reference to FIG. 6A, the lowering or further insertion of the second body 1004 into the first body 1002 increases thickness of the adjustable spacer, lifting and separating the fingers 1206 from the support member 1006. The tab 1214 of the tip of the third finger 1210 is moved leftward in FIG. 5B, with more of the tip of the third finger 1210 passing through the aperture 1114 of the support member 1006 (see FIG. 2A). Less of the posts 1204 are visible to the right of the support member 1006. Dimensions of the first body 1002 and the second body 1004 should be set so that the thickness of the adjustable spacer in this greater thickness arrangement is in the vicinity of (or possibly, greater than) the maximum spacing between the connector 1010 (or other component) and the support member 1006 (or other member or service) resulting from manufacturing tolerances. The second body 1004 may be able to lower or insert further, or this may be a maximum depth or insertion and lowermost location of the second body 1004.

Figure 6A:
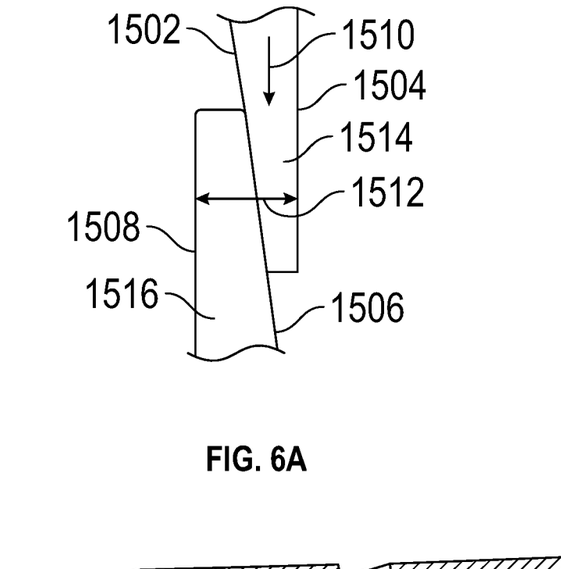
FIG. 6A is a cross-section view of two wedge-shaped bodies in slidable contact with each other, to illustrate principles of thickness and spacing adjustment as applicable to embodiments of the adjustable spacer.

FIG. 6A is a cross-section view of two wedge-shaped bodies 1514, 1516 in slidable contact with each other, to illustrate principles of thickness 1512 and spacing adjustment as applicable to embodiments of the adjustable spacer. External faces 1508, 1504 (or outward faces) of this two body 1514, 1516 assembly or arrangement are parallel in this depiction and remain parallel through the positioning or adjustment of the first wedge-shaped body 1516 and the second wedge-shaped body 1514 so long as the inner faces 1502, 1506 remain touching. This is because the angle of the wedge for the first wedge-shaped body 1516 is equal (or approximately so) to the angle of the wedge for the second wedge-shaped body 1514. Geometrically, the external faces 1508, 1504 are parallel to each other, and the inner faces 1502, 1506 are not parallel to the external faces 1508, 1504 but are instead offset from the external faces 1508, 1504 by the same wedge angle. Because the wedges are arranged in opposing directions, sliding the inner face 1502 of the second wedge-shaped body 1514 along the inner face 1506 of the first wedge-shaped body 1516 as the second wedge-shaped body 1514 moves in a downward direction 1510 increases the thickness 1512 between the external faces 1508, 1504 while maintaining the external faces 1508, 1504 parallel. Applying these principles to embodiments of the adjustable spacer is advantageous when the components to be spaced by the adjustable spacer, e.g., the connector 1010 and the support member 1006, have faces to be pressed upon by the external faces of the adjustable spacer.

Figure 6B:
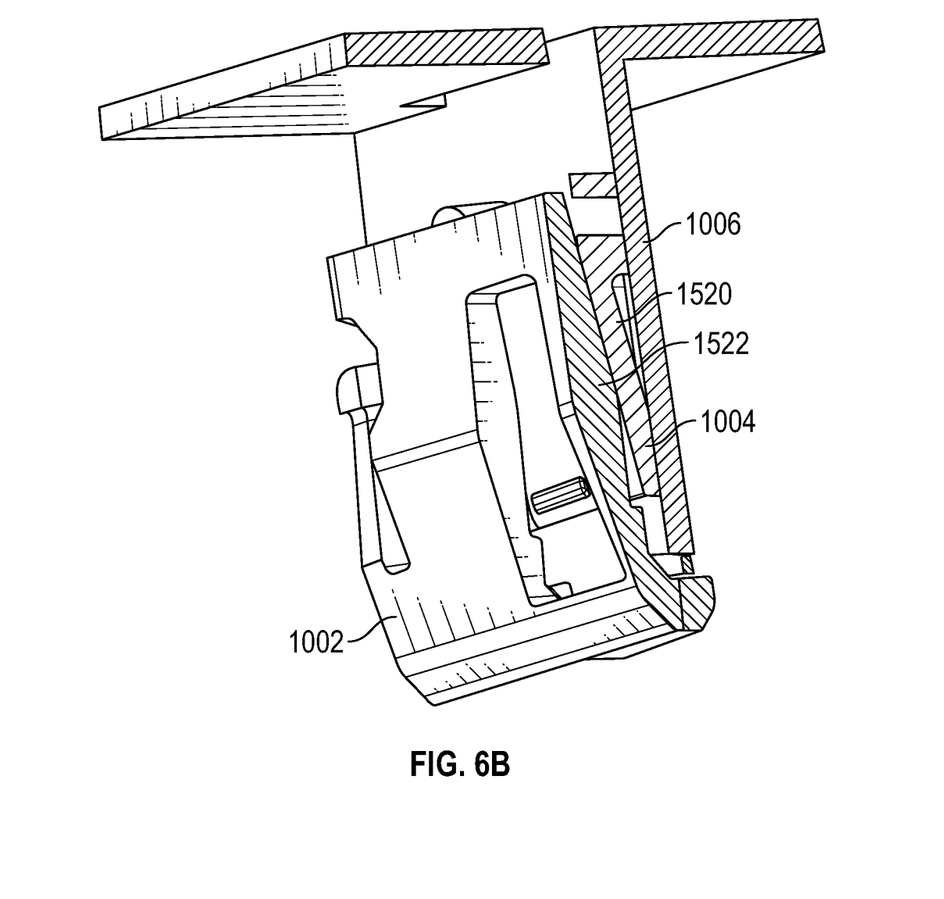
FIG. 6B is a perspective cutaway view of an embodiment of the adjustable spacer mounted to a support member, depicting a cross-section that embodies the principles of the two wedge-shaped bodies in slidable contact, of FIG. 6A.

FIG. 6B is a perspective cutaway view of an embodiment of the adjustable spacer mounted to a support member, depicting a cross-section that embodies the principles of the two wedge-shaped bodies in slidable contact, of FIG. 6A. The first body 1002 of the adjustable spacer has an upper portion 1522 with a wedge-shaped cross-section, tapering upward like the first wedge-shaped body 1516 of FIG. 6A. Second body 1004 of the adjustable spacer has a wedge-shaped cross-section, tapering downward like second wedge-shaped body 1514 of FIG. 6A. Wedge angles are approximately equal for the first body 1002 and the second body 1004. The assembly of the first body 1002 and the second body 1004, to form the adjustable spacer, maintains two external or outward facing faces that are parallel throughout the adjustment of the second body 1004, optimally suiting use of the adjustable spacer to fill the space between two parallel faces of opposed components.

Figure 7:
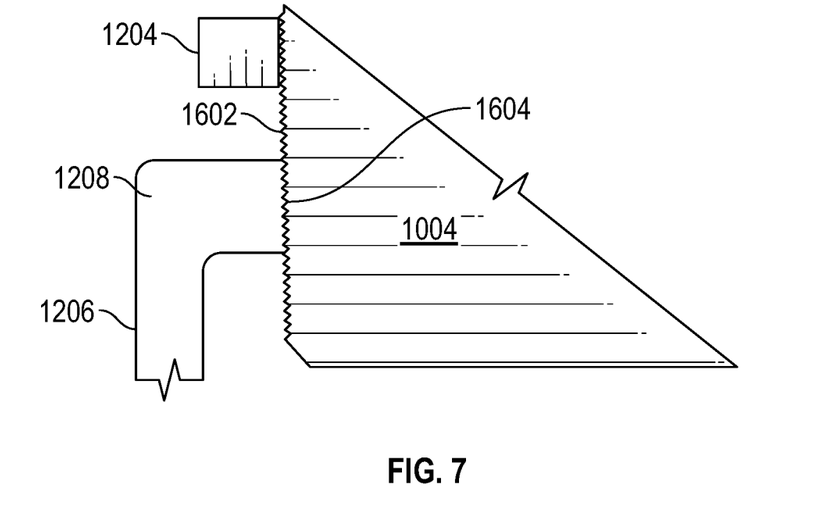
FIG. 7 is a cross-section view in close up of a tip of a finger of the first body of the adjustable spacer, with teeth that engage teeth of the second body of the adjustable spacer to hold position of the second body.

FIG. 7 is a cross-section view in close up of a tip 1208 of a finger 1206 of the first body 1002 of the adjustable spacer, with teeth 1604 that engage teeth 1602 of the second body 1004 of the adjustable spacer to hold position of the second body 1004. In one embodiment, the tips 1208 of both fingers 1206 to either side of the first body 1002 have teeth 1604, and both sides of the second body 1004 have teeth 1602. As the second body 1004 is pressed downward, into further insertion into the first body 1002, the teeth 1604, 1602 alternately disengage and re-engage. In variations, the teeth could be directional to provide a one-way ratcheting mechanism, so that insertion of the second body 1004 to the first body 1002 is easier, but removal or backing out of the second body 1004 is more difficult or less likely to occur under vibration. There could be teeth present on one but not the other finger 1206. A friction surface could be employed in place of teeth. An edge and grooves, pin and grooves, or pin and holes mechanism could be used. Further mechanisms for retaining position of an adjustable piece are readily substituted for further embodiments.

Figure 8A:
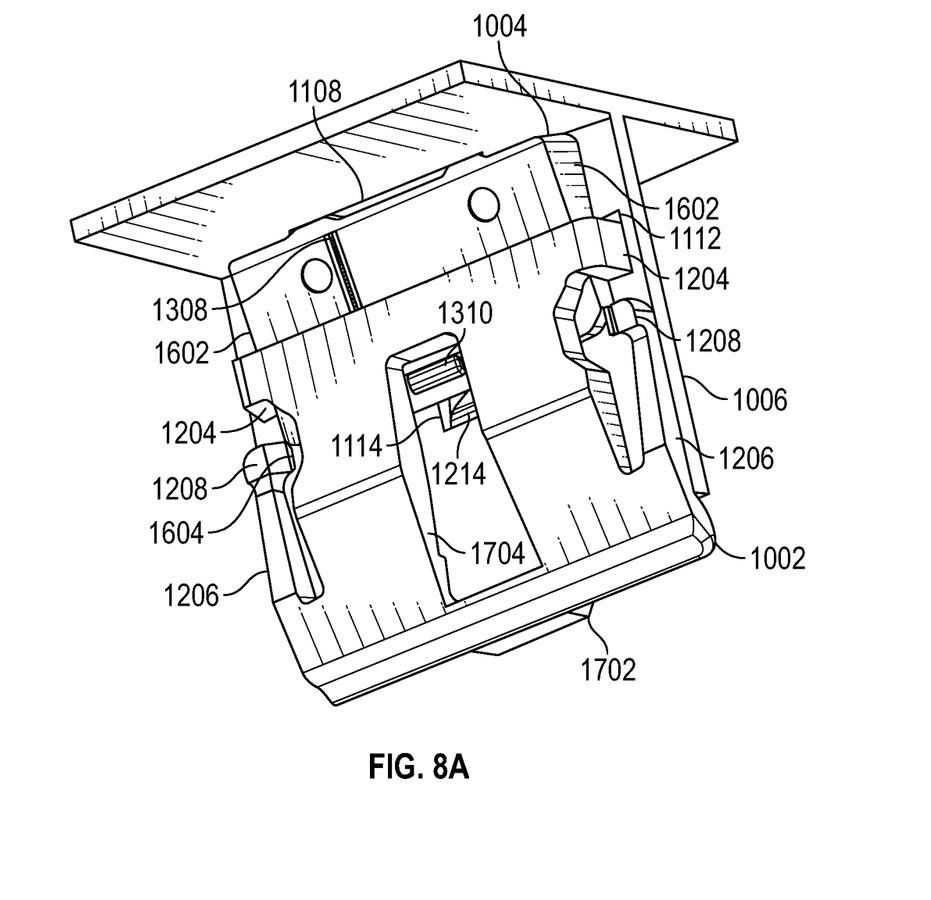
FIG. 8A is a perspective view of an assembly of the support member and first and second bodies of the adjustable spacer, with the second body partially inserted to the first body as in FIG. 5A.

FIG. 8A is a perspective view of an assembly of the support member and first and second bodies 1002, 1004 of the adjustable spacer, with the second body 1004 partially inserted to the first body 1002 as in FIG. 5A. The second body 1004 is at the top of travel relative to the first body 1002 and available space constraints imposed by a horizontal ceiling portion of the support member 1006, for the minimum thickness of the adjustable spacer in this arrangement. Teeth 1604 (see FIG. 7) of the fingers 1206 of the first body 1002 are seen engaging with the very first few teeth 1602 at the bottom of the second body 1004. The tab 1310 of the second body 1004 is near the top of the opening 1704 or slot in the first body 1002, constraining the second body 1004 from being pulled higher. Tab 1214 of third finger 1210 of first body 1002 is seen extending into or through aperture 1114 in the support member 1006, ready to engage the groove 1304 of the second body 1004 (see FIG. 4A) if or when the second body 1004 is moved further downward (see FIGS. 5B and 8B). Ridge 1308 of the second body 1004 is visible, with the lower portion of the ridge 1308 beginning to engage the groove 1212 in the first body 1002 (obscured, but see FIG. 3A). Both of the posts 1204 and the tips 1208 of the fingers 1206 of the first body 1002 retain and guide the second body 1004. Although most of the third finger 1210 is obscured except for the tab 1214, the bottom portion or base 1702 of the third finger 1210 is visible at the bottom of the first body 1002. Projections 1306 from the second body 1004 extend upwards through the aperture 1108 in the support member 1006, ready for tool usage or manual contact to adjust the positioning of the second body 1004.

Figure 8B:
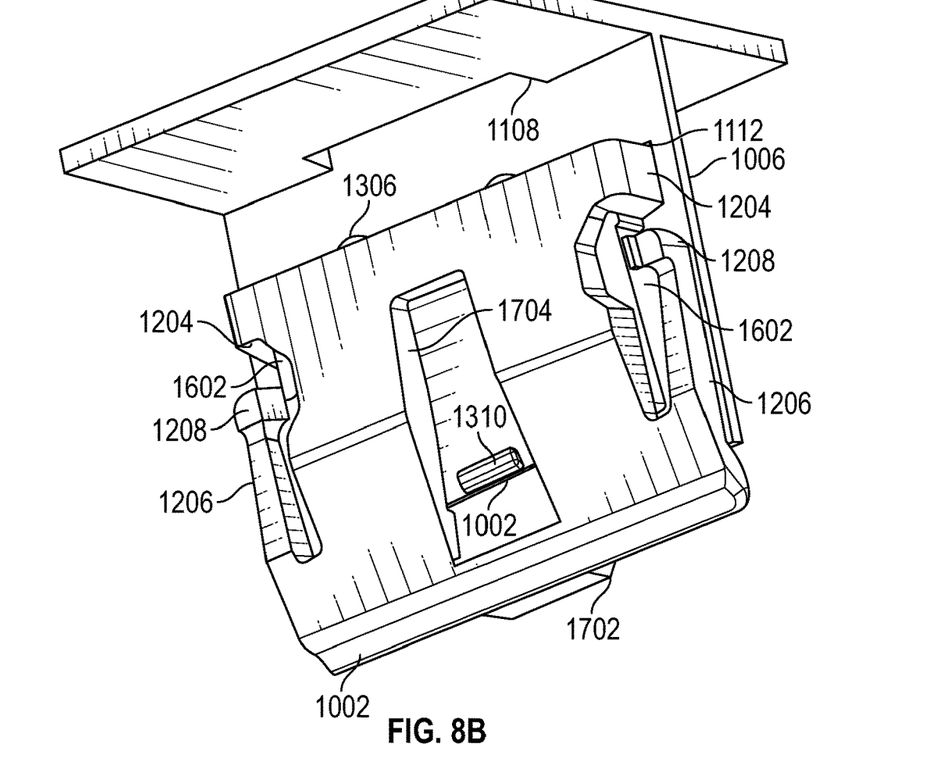
FIG. 8B is a perspective view of an assembly of the support member and first and second bodies of the adjustable spacer, with the second body more fully inserted to the first body as in FIG. 5B.

FIG. 8B is a similar perspective view of an assembly of the support member and first and second bodies 1002, 1004 of the adjustable spacer, with the second body 1004 more fully inserted to the first body 1002 as in FIG. 5B. The second body 1004 is at or near the bottom of travel relative to the first body 1002, for greater thickness of the adjustable spacer in this arrangement than in that of FIG. 8A. Teeth 1604 (See FIG. 7) of the fingers 1206 of the first body 1002 are seen engaging with the uppermost teeth, or nearly so, of the sides of the second body 1004. Both of the posts 1204 and the tips 1208 of the fingers 1206 of the first body 1002 continue to retain and guide the second body 1004. Projections 1306 from the second body 1004 are barely visible at the top of the first body 1002. The tab 1310 of the second body 1004 is near the bottom of the opening 1704 or slot in the first body 1002, allowing for upward movement of the second body 1004 if needed.

Figure 9:
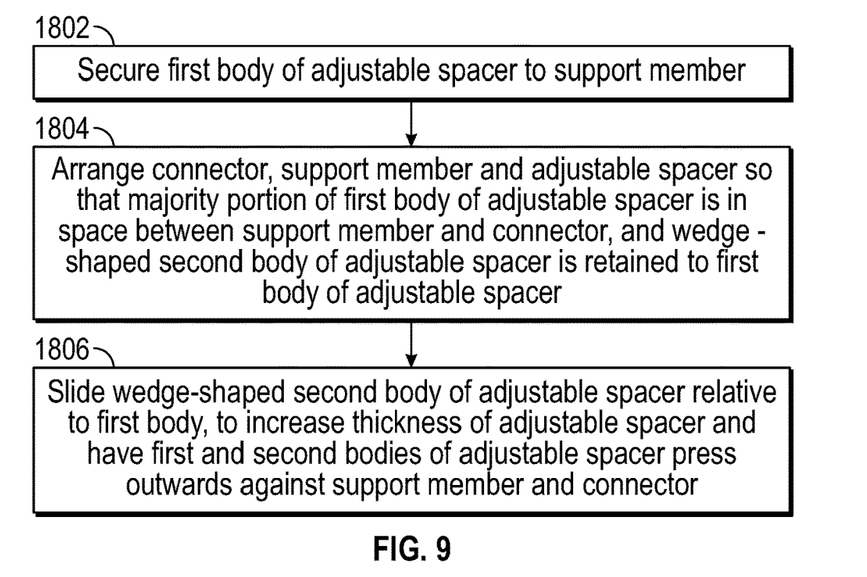
FIG. 9 is a flow diagram of a method of using an adjustable spacer, which can be practiced using embodiments described herein and variations thereof.

FIG. 9 is a flow diagram of a method of using an adjustable spacer, which can be practiced using embodiments described herein and variations thereof. The method can be performed with an adjustable spacer that has a first body and a second body, and can be performed by a user, for example an assembly technician, or automation equipment, including robotics assembly. In an action 1802, a first body of the adjustable spacer is secured to a support member. In embodiments described herein, the securing is done using solely the adjustable spacer without additional fasteners. In further embodiments, other mechanisms for securing could be used. It should be appreciated that in some embodiments the second body may be inserted with the first body prior to securing the first body to a support member. In other embodiments, the second body may be placed into the first body after securing the first body to a support member.

In an action 1804, a connector, a support member and the adjustable spacer are arranged. These pieces are arranged so that the majority portion of the first body of the adjustable spacer is in a space between the support member and the connector. These pieces are arranged so that the wedge-shaped second body of the adjustable spacer is retained to the first body of the adjustable spacer. In embodiments described herein, posts and fingers each retain the second body to the first body. In further embodiments, other mechanisms for securing the second body to the first body could be used, e.g., screws, glue, insert molds, etc.

In an action 1806, the wedge-shaped second body of the adjustable spacer is slid relative to the first body. Sliding the wedge-shaped second body relative to the first body increases the thickness of the adjustable spacer. The first and second bodies of the adjustable spacer press outwards against the support member and the connector. By filling in available space between the support member in the connector, the adjustable spacer, in proper adjustment, reduces or eliminates flexure of the printed circuit board or other member on which the connector is mounted.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. In some embodiments, the adjustable spacer may be integrated with various electronic equipment, such as switches, routers, and other assemblies, where connectors are mating to couple electronic assemblies.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry or mechanical features) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits or manufactured articles) that are adapted to implement or perform one or more tasks, or designing an article or apparatus to have certain features or capabilities.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An adjustable spacer, comprising:
    a first body having a first retention member for securing or retaining the first body to a support member;
    a second body having a tapered cross-section;
    the second body positionable between a surface of the first body and a surface of the support member and configured to slide along the surface of the support member to adjust a thickness across a combination of the first body and the second body; and
    the first body having a second retention member for retaining the second body to the first body.

2. The adjustable spacer of claim 1, wherein the second body positionable along the surface of the first body comprises adjustability of the thickness across the combination of the first body and the second body to span a space between the support member and a component in an assembly comprising the support member, the adjustable spacer and the component.

3. The adjustable spacer of claim 1, wherein the adjustable spacer comprises a single unitary structure having the first body and the second body.

4. The adjustable spacer of claim 1, wherein the second retention member comprises a first finger dimensioned for insertion through a third aperture of the support member to touch the second body.

5. The adjustable spacer of claim 1, wherein the second retention member comprises a second finger and a third finger to grip sides of the second body.

6. The adjustable spacer of claim 1, further comprising:
    the first body having a slot in or through the surface of the first body; and
    the second body having a tab dimensioned to engage the slot.

7. The adjustable spacer of claim 1, wherein the thickness across the combination of the first body and the second body is between two parallel faces of the combination of the first body and the second body.

8. An adjustable spacer, comprising: a first body having one or more posts for securing or retaining the first body to a support member; a second body positionable between a surface of the first body and a surface of the support member, the second body having a wedge with a surface that is slidable along the surface of the first body to adjust a thickness across an assembly of the first body and the second body; and the first body having a finger to retain the second body to the first body.

9. The adjustable spacer of claim 8, wherein adjustment of the second body relative to the first body adjusts the thickness across the assembly of the first body and the second body to span a space between the support member and a component in a further assembly comprising the support member, the adjustable spacer and the component.

10. The adjustable spacer of claim 8, wherein the one or more posts of the adjustable spacer comprises a single unitary structure having the first body and the second body.

11. The adjustable spacer of claim 8, further comprising:
    the finger is to hold the second body between a majority of the first body and the finger.

12. The adjustable spacer of claim 8, further comprising:
    the second body having teeth along sides of the wedge; and
    the first body having two further fingers, each having teeth to engage the teeth of the second body.

13. The adjustable spacer of claim 8, wherein:
    two outer surfaces of the assembly of the first body and the second body comprise a further surface of the wedge and a further surface of the first body;
    the two outer surfaces of the assembly of the first body and the second body are parallel to each other; and
    the surface of the wedge that is slidable along the surface of the first body, and the surface of the first body, are not parallel to the two outer surfaces, in the assembly of the first body and the second body.

14. A method of using an adjustable spacer, comprising:
    securing a first body of the adjustable spacer to a support member;
    arranging a connector, the support member and the adjustable spacer to have a portion of the first body in a space between the support member and the connector, and a wedge-shaped second body of the adjustable spacer retained to the first body; and sliding the wedge-shaped second body of the adjustable spacer relative to the first body, to increase a thickness of a cross-section across the second body and the portion of the first body and have the first and second bodies press outwards against the support member and the connector, across the space between the support member and the connector.

15. The method of using an adjustable spacer of claim 14, further comprising:

holding the second body to the first body, by a finger and two posts of the first body.

16. The method of using an adjustable spacer of claim 14, further comprising:

engaging teeth of two fingers of the first body to teeth of the second body, to retain a position of the second body relative to the first body.

17. The method of using an adjustable spacer of claim 14, wherein securing the first body of the adjustable spacer to the support member comprises:

clasping the support member between the portion of the first body and a finger of the first body; and inserting two posts of the first body into apertures, slots or depressions in the support member.

18. The method of using an adjustable spacer of claim 14, further comprising:

engaging a tab of the second body to a slot in or through the first body, wherein the tab and the slot constrain the sliding the wedge-shaped second body relative to the first body.

19. The method of using an adjustable spacer of claim 14, wherein the arranging the connector, the support member and the adjustable spacer comprises:

arranging a first outer face of the adjustable spacer, comprising a first face of the first body, to be parallel with a second outer face of the adjustable spacer, comprising a first face of the second body, the first outer face and the second outer face to remain parallel, while a second face of the first body and a second face of the second body remain touching, during the sliding the wedge-shaped second body relative to the first body.

20. The method of using an adjustable spacer of claim 14, further comprising:

inserting a tab of a finger of the first body through an aperture of the support member and into a groove of the second body.

\* \* \* \* \*